(12) United States Patent
Joshi

(10) Patent No.: US 7,029,947 B2
(45) Date of Patent: Apr. 18, 2006

(54) FLIP CHIP IN LEADED MOLDED PACKAGE WITH TWO DIES

(75) Inventor: Rajeev Joshi, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 112 days.

(21) Appl. No.: 10/834,752

(22) Filed: Apr. 28, 2004

(65) Prior Publication Data

US 2004/0201086 A1   Oct. 14, 2004

Related U.S. Application Data

(62) Division of application No. 09/730,932, filed on Dec. 4, 2000, now Pat. No. 6,798,044.

(51) Int. Cl.
    *H01L 21/44* (2006.01)
    *H01L 21/48* (2006.01)
    *H01L 21/50* (2006.01)

(52) U.S. Cl. ............... 438/110; 438/111; 438/112; 438/127

(58) Field of Classification Search ............. 438/112, 438/127
    See application file for complete search history.

(56) References Cited

U.S. PATENT DOCUMENTS

| | | | |
|---|---|---|---|
| 5,319,242 A | | 6/1994 | Carney et al. |
| 5,637,916 A | | 6/1997 | Joshi |
| 5,765,280 A | | 6/1998 | Joshi |
| 5,789,809 A | | 8/1998 | Joshi |
| 6,133,067 A | * | 10/2000 | Jeng et al. ............ 438/110 |
| 6,133,634 A | | 10/2000 | Joshi |
| 6,184,573 B1 | * | 2/2001 | Pu ....................... 257/668 |
| 6,294,403 B1 | | 9/2001 | Joshi |
| 6,469,384 B1 | | 10/2002 | Joshi |
| 6,489,678 B1 | | 12/2002 | Joshi |
| 6,566,749 B1 | | 5/2003 | Joshi et al. |
| 6,627,991 B1 | | 9/2003 | Joshi |
| 6,633,030 B1 | | 10/2003 | Joshi |
| 6,661,082 B1 | | 12/2003 | Granada et al. |
| 6,683,375 B1 | | 1/2004 | Joshi et al. |
| 6,720,642 B1 | | 4/2004 | Joshi et al. |
| 2002/0066950 A1 | | 6/2002 | Joshi |
| 2002/0066959 A1 | | 6/2002 | Joshi |
| 2002/0100962 A1 | | 8/2002 | Joshi et al. |
| 2002/0192935 A1 | | 12/2002 | Joshi et al. |
| 2003/0011005 A1 | | 1/2003 | Joshi |
| 2003/0042403 A1 | | 3/2003 | Joshi |
| 2003/0075788 A1 | | 4/2003 | Joshi et al. |
| 2003/0107128 A1 | | 6/2003 | Joshi |
| 2003/0122247 A1 | | 7/2003 | Joshi |
| 2003/0173684 A1 | | 9/2003 | Jpshi et al. |
| 2003/0197278 A1 | | 10/2003 | Joshi et al. |

\* cited by examiner

*Primary Examiner*—Richard Booth
*Assistant Examiner*—Ron Pompey
(74) *Attorney, Agent, or Firm*—Townsend and Townsend and Crew LLP

(57) ABSTRACT

A chip device including two stacked dies. The chip device includes a leadframe that includes a plurality of leads. A first die is coupled to a first side of the leadframe with solder and a second die is coupled to a second side of the leadframe with solder. A molded body surrounds at least a portion of the leadframe and the dies.

7 Claims, 2 Drawing Sheets

FLIP CHIP IN LEADED MOLDED PACKAGE WITH TWO DIES

CROSS REFERENCE TO RELATED APPLICATIONS

This application is a divisional application of U.S. patent application Ser. No. 09/730,932, filed Dec. 4, 2000 U.S. Pat. No. 6,798,044 and this application is herein incorporated by reference in its entirety for all purposes.

BACKGROUND OF THE INVENTION

1. Field of the Invention

The present invention relates to a flip chip in a leaded molded package, and more particularly, to a flip chip in a leaded molded package with two stacked dies.

2. Description of the Prior Art

Semiconductor devices are becoming smaller and smaller. Additionally, as the need for speed, power and capacity increases, such a reduction in size leads to a contradiction in that smaller devices often have smaller capabilities.

In order to create smaller devices but with increased capabilities, the prior art has attempted to stack dies on top of one another. However, the prior art currently uses wire bonding for its interconnect scheme, which leads to higher resistance and inductance and does not allow for as thin a package as desired. Additionally, using wire bond techniques does not allow for the drain regions of a power MOSFET die to be exposed.

SUMMARY OF THE INVENTION

The present invention provides a chip device that includes a leadframe or a substrate that includes a plurality of leads. A first die is flipped onto the leadframe and the leadframe and die are then flipped together. A second die is then flipped onto the leadframe. The two dies are coupled to the leadframe with solder bumps. A molded body is placed around the dies and the leadframe such that the drain area of at least the first die is exposed.

In accordance with one aspect of the present invention, the first die is attached to the leadframe with a higher temperature reflow process while the second die is attached to the leadframe using a lower temperature reflow process.

In accordance with another aspect of the present invention, the first die of the chip device is a MOSFET while the second die is a controller IC.

Thus, the present invention provides a chip device that includes two dies stacked atop one another. The use of solder bumps allows for a small profile package. In addition, the non-use of wire bond interconnect allows for accommodating a very large size die for a given molded package body outline. A die size in excess of 150% of the nominal wire bonded package size may be accommodated by this arrangement.

Other features and advantages of the present invention will be understood upon reading and understanding the detailed description of the preferred exemplary embodiments, found hereinbelow in conjunction with reference to the drawings in which like numerals represent like elements.

DETAILED DESCRIPTION OF THE PREFERRED EXEMPLARY EMBODIMENTS

Figure 1:
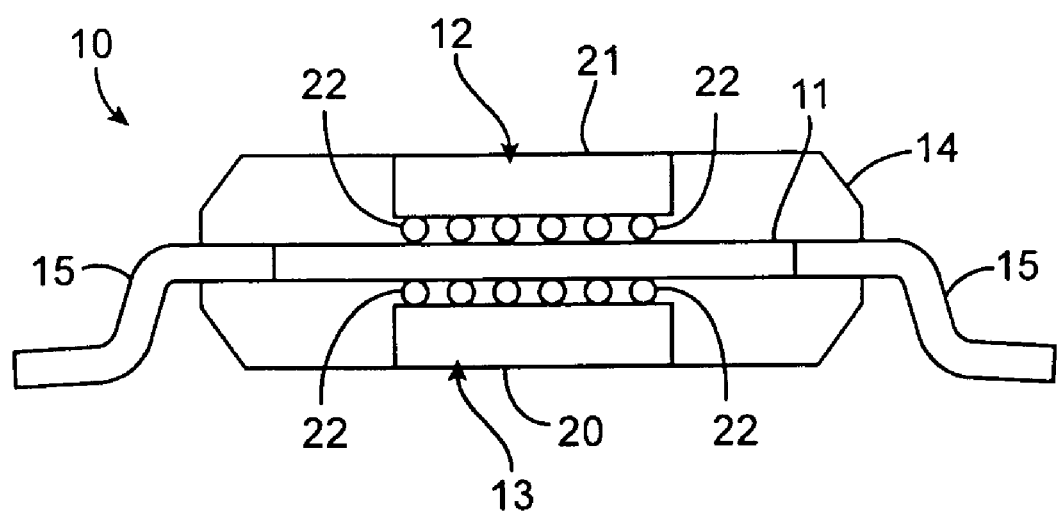
FIG. 1 is a side sectional view of a chip device in accordance with the present invention.

FIG. 1 provides a cross-sectional view of a chip device 10 with a leaded molded package in accordance with the present invention. The device includes a leadframe 11, two dies 12, 13 coupled to the leadframe and a molded body 14 placed around the coupled dies and leadframe. The leadframe includes a plurality of leads 15.

The chip device is preferably created by placing the leadframe "upside-down" and flipping first die 12 onto the backside of the leadframe. Preferably, the die is what is commonly referred to in the industry as a "bumped die." Alternatively, solder paste or solder bumps may be placed onto the leadframe prior to flipping the die thereon. The die is then attached to the leadframe with a high temperature reflow process.

Figure 1A:
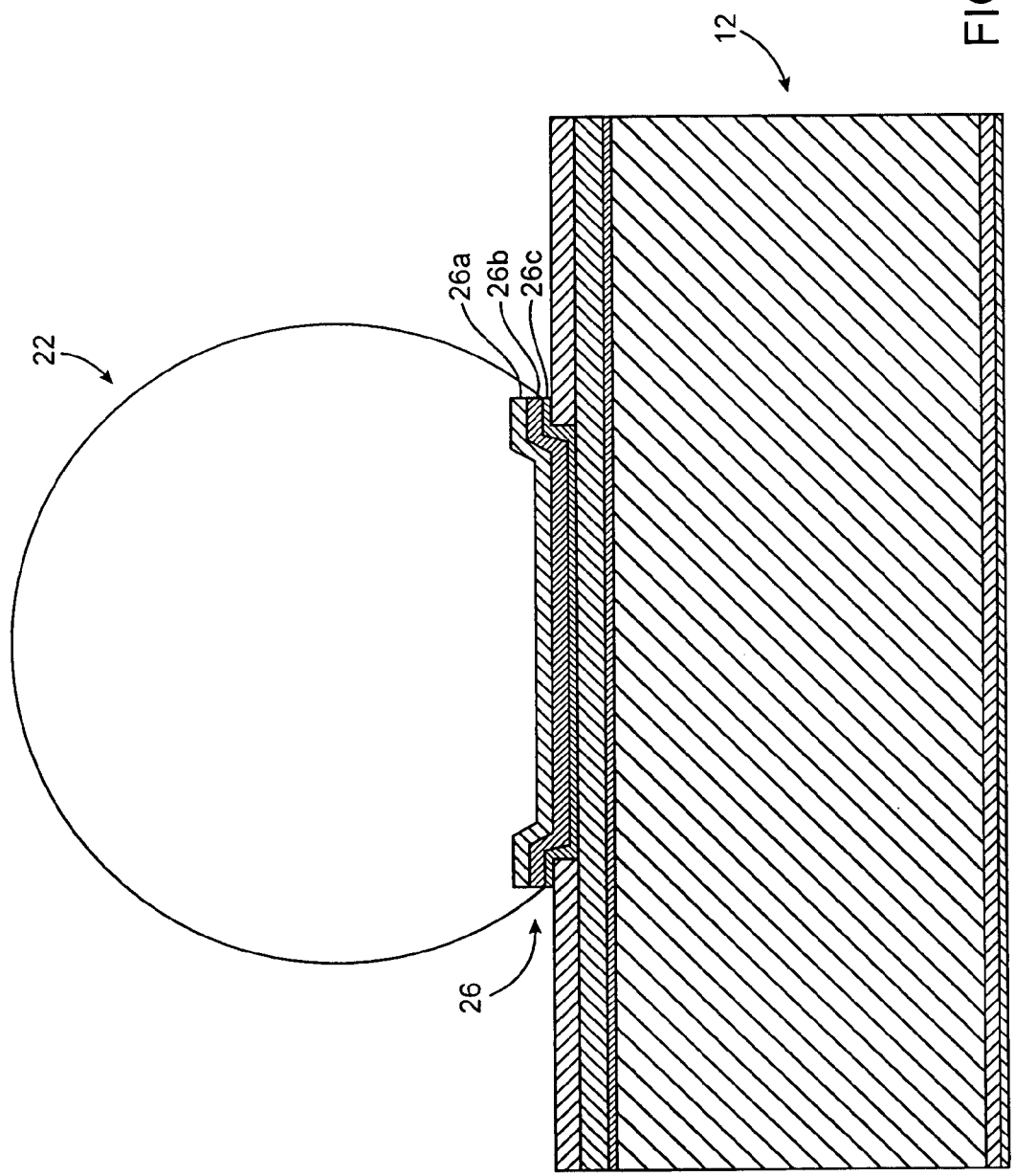
FIG. 1A is a schematic side sectional view of a bumped die.

First die 12 is preferably a one-piece item that is often referred to in the art as a "bumped die." As can be seen in FIG. 1A, a bumped die includes first die 12, "under bump material" that serves as an intermediate layer 26 between the top surface of the die and solder bump 22, and the solder bumps themselves. Preferably, the under bump material is one of TiW, Cu, Au or an equivalent. In the example illustrated in FIG. 1A, the under bump material is broken into three layers—Cu plating 26a, sputtered Cu 26b and sputtered Ti 26d.

The leadframe with the first die coupled thereto is then flipped. Second die 13 is then attached to the top side of the leadframe. Once again, the second die is preferably a bumped die. Alternatively, solder bumps or solder paste may be placed onto the leadframe prior to placing the die thereon. In order to avoid the first die solder from reflowing, a lower temperature reflow process is used to reflow the solder between the second die and the leadframe. The "higher" temperature solder preferably has a melting around point 310° C., and could be for example, 95/5 Pb/Sn. The "lower" temperature solder Sn/Sb having a melting point around are 250° C.

Molded body 14 is then placed around the leadframe and the dies coupled thereto. Preferably, drain region 20 of the first die is exposed through the body. Additionally, back side of the second die may be exposed through the top of the body where an optional heat sink may be attached for further improved heat dissipation.

Thus, the manufacturing process may be used to produce high density packaging, when a higher cell density silicon is not available, or when the higher cell density silicon die size is so large that it will not fit into a small package. In memory devices, a mirror image of two identical dies being stacked together creates a higher density memory cell with a smaller footprint. In intelligent load switches (ILS), a higher pin IC may be effectively combined with a three-terminal MOSFET to produce a package with the smallest number of pins (smallest package) as the drain region of the MOSFET may be connected to the printed circuit board (PCB) directly due to the draining region being exposed through the bottom of the body, thus, directly saving I/O pins on the package. A high current intelligent load switch may therefore be constructed that has the dual advantage of small footprint and very superior thermal performance.

Additionally, the present invention may be used to create a chip device arrangement where a controller IC is combined with a MOSFET in a small package outline, thus forming the intelligent load switch. Since the backside (drain) region of first die 12, the MOSFET, is exposed, it may be attached directly to the PCB to provide a good thermal path and a low resistance drain contact. The arrangement saves a couple of I/O pins that allows the package to have a low I/O count, thus reducing its size. Connections between the IC's and the MOSFET's source and gate may be accomplished easily by routing the leadframe as needed, facilitating a low-resistance (high current) connection.

The use of solder bumps in the chip device also contributes to the small profile package (either through use of solder bumps directly or through use of a bumped die), e.g., each die may be 8 mils thick, the solder bumps may be 6 mils, the leadframe about 6 mils, and the molded body about 6 mils, thus giving a total package height of approximately 34 mils (0.8 mm). In addition, the non-use of wire bond interconnect allows for accommodating a very large size die for a given molded package.

Although the invention has been described with reference to specific exemplary embodiments, it will appreciated that it is intended to cover all modifications and equivalents within the scope of the appended claims.

What is claimed is:

1. A method of making a chip device, the method comprising:
   providing a leadframe comprising a plurality of leads;
   placing a first die on a first side of the leadframe with first solder therebetween;
   reflowing the first solder at a first temperature;
   flipping the leadframe;
   placing a second die on a second side of the leadframe with second solder therebetween; and
   reflowing the second solder at a second temperature lower than the first temperature.

2. A method of making a chip device, the method comprising:
   providing a leadframe comprising a plurality of leads;
   flipping a first die on a first side of the leadframe with first solder therebetween;
   reflowing the first solder at a first temperature;
   flipping the leadframe;
   flipping a second die on a second side of the leadframe with second solder therebetween;
   reflowing the second solder at a second temperature lower than the first temperature; and
   forming a molded body around at least a portion of the leadframe and the dies.

3. A method of making a chip device, the method comprising:
   providing a leadframe comprising a plurality of leads;
   placing a first die on a first side of the leadframe with first solder therebetween;
   placing a second die on a second side of the leadframe with second solder therebetween;
   reflowing the first solder;
   reflowing the second solder; and
   forming a molded body around at least a portion of the leadframe and the dies wherein the first solder has a higher melting temperature than the second solder.

4. The method of claim 3 wherein the first die comprises a MOSFET.

5. The method of claim 3 wherein a first exterior surface of the molded body is coplanar with a first surface of the first die and a second exterior surface of the molded body is coplanar with a second surface of the second die.

6. The method of claim 3 wherein the first solder comprises Pb/Sn and the second solder comprises Sn/Sb.

7. The method of claim 3 wherein the first die includes a MOSFET and the second die comprises a controller IC.

* * * * *

UNITED STATES PATENT AND TRADEMARK OFFICE
CERTIFICATE OF CORRECTION

PATENT NO. : 7,029,947 B2  Page 1 of 1
APPLICATION NO. : 10/834752
DATED : April 18, 2006
INVENTOR(S) : Rajeev Joshi It is certified that error appears in the above-identified patent and that said Letters Patent is hereby corrected as shown below:

Column 4, line 19, please insert --;-- after "dies".

Signed and Sealed this

Twenty-fifth Day of July, 2006

JON W. DUDAS
*Director of the United States Patent and Trademark Office*